US006873567B2

(12) United States Patent
Buettner et al.

(10) Patent No.: US 6,873,567 B2
(45) Date of Patent: Mar. 29, 2005

(54) DEVICE AND METHOD FOR DECODING AN ADDRESS WORD INTO WORD-LINE SIGNALS

(75) Inventors: Stefan Buettner, Sindelfingen (DE); Jens Leenstra, Bondorf (DE); Juergen Pille, Stuttgart (DE); Christian Schweizer, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/636,387

(22) Filed: Aug. 7, 2003

(65) Prior Publication Data

US 2004/0027885 A1 Feb. 12, 2004

(30) Foreign Application Priority Data

Aug. 9, 2002 (EP) .............................. 02102121

(51) Int. Cl.[7] .................................. G11C 8/00
(52) U.S. Cl. .............................. 365/230.06; 365/230.05
(58) Field of Search ...................... 365/230.06, 230.05, 365/230.08, 230.01

(56) References Cited

U.S. PATENT DOCUMENTS

| 4,558,433 A | | 12/1985 | Bernstein ..................... 365/189 |
| 5,295,115 A | * | 3/1994 | Furuya et al. .......... 365/230.06 |
| 5,502,683 A | * | 3/1996 | Marchioro ............. 365/230.05 |
| 5,677,883 A | * | 10/1997 | Miwa ......................... 365/200 |
| 6,700,822 B1 | * | 3/2004 | Wang .................... 365/189.05 |

* cited by examiner

Primary Examiner—Anh Phung
(74) Attorney, Agent, or Firm—Eugene I. Shkurko

(57) ABSTRACT

A method and a device for decoding an address word into word-line signals. A plurality of address lines feed the address word into a plurality of decoding blocks each associated to a particular address in the address space formed by the address word for generating a respective word-line signals, whereby each of the decoding blocks is connected to the plurality of address lines. At least one decoding block associated to a predetermined address in the address space formed by the address word is omitted, so that none of the generated word lines is switched to the active state, whenever the predetermined address word is inputted over the plurality of address lines.

9 Claims, 2 Drawing Sheets

DEVICE AND METHOD FOR DECODING AN ADDRESS WORD INTO WORD-LINE SIGNALS

BACKGROUND OF THE INVENTION

The present invention generally relates to random access read/write memory devices. Particularly, the present invention relates to a method and a device for decoding an address word into word-line signals using the ripple-domino concept. More particularly, it relates to a multiple-port storage array structure having a device for word decoding in accordance with the present invention.

In microprocessors high speed registers as local storage are provided, which allow that each register can be separately addressable from a multiplicity of data-in ports for a write and separately addressable to a multiplicity of data-out ports for a read. The data, in the register, thus is addressable at any data-in port and readable at any data-out port. Such multi-port devices comprise, for example, three bit memory configurations, arranged with independent read and write addressing, so that upon a write, the identical information is written into each configuration, in the identical address position, so that each of the three configurations contain the same information in the same address positions, then a simultaneous read of the three configurations in three different positions, i.e., three different addresses, will present three different words to each of the three different out ports.

From U.S. Pat. No. 4,558,433 by Kerry Bernstein, assigned to IBM Corporation, Armonk, N.Y., US, filed May 31, 1983, issued Dec. 10, 1985, "Multi-Port Register Implementations" an improved support circuitry for a memory array is known, which utilizes means for comparing the address inputs of word decoders in a memory array such that, when a compare occurs, selected ones of the array word decoders are disabled to prevent a multiple read, and selected higher order read heads are inhibited while switching the output data onto all of the output lines having the same address as the uninhibited word decoder. Address comparison means, in the event of a compare between addresses on said set of input lines, provides a signal simultaneously to said high order word decoders and to said high order read heads to disable selected ones of said high order word decoders and inhibit selected ones of said high order read heads from reading more than one set of simultaneously addressed bit lines from the cell while switching the inhibited high order read heads to output read lines having the same address as the low order decoder.

In order to provide high-speed functionality such random access read/write devices are designed using the ripple-domino concept.

In designs of integrated circuits a general scheme for reducing the overall power consumption is to deactivate units that are currently not needed, such as floating point units or storage arrays, by gating the clock or data. This in turn makes a special control signal necessary, e.g., a select or enable signal, which has to be available before the next evaluation cycle starts.

In the case of storage arrays an array-enable-signal may be used to gate the clock signal and thereby disable the functionality of the whole array. However, the enable signal becomes the most critical one in the view of timing conditions, because it has to be valid before the next cycle starts. Furthermore, extra control logic inside the array would be needed, which affects the access time.

Furthermore, in order to control the ports of a multi-port array, an enable-signal is needed for every single port. This increases the number of input signals of the array.

BRIEF SUMMARY OF THE INVENTION

The object of the present invention is to efficiently disable the word-decoding unit in a random access read/write memory device.

According to the present invention a method and a device is provided for decoding an address word into word-line signals. A plurality of address lines feed the address word into a plurality of decoding blocks each associated to a particular address in the address space formed by the address word for generating a respective word-line signals, whereby each of the decoding blocks is connected to the plurality of address lines.

At least one decoding block associated to a predetermined address in the address space formed by the address word is omitted, so that none of the generated word lines is switched to the active state, whenever the predetermined address word is inputted over the plurality of address lines.

In a preferred embodiment of the present invention a clock signal line for inputting a clock signal is provided, whereby the clock signal line is directly connected to each of the decoding blocks. Hence, advantageously no delay is introduced in the clock path.

In order to allow high-performance operation, the decoding block is implemented using the ripple-domino concept.

Preferably, the address word is n+1-Bit wide forming an address space of address 0 to address $2^{n+1}-2$, whereby n is a positive integer number.

In another embodiment of the present invention a k-port storage array structure having a memory cell for storing information and k address ports for inputting address words is equipped with k devices for decoding an address word into word-line signals as described herein.

Optionally the k-port storage array structure further comprises a central circuit for delivering the clock signal to the k devices for decoding an address word, whereby the central circuit is adapted to block the clock signal depending on an enable signal provided to the central circuit.

BRIEF DESCRIPTION OF THE SEVERAL VIEWS OF THE DRAWING

These and other objects will be apparent to one skilled in the art from the following detailed description of the invention taken in conjunction with the accompanying drawings in which.

DETAILED DESCRIPTION OF THE INVENTION

Figure 1A:
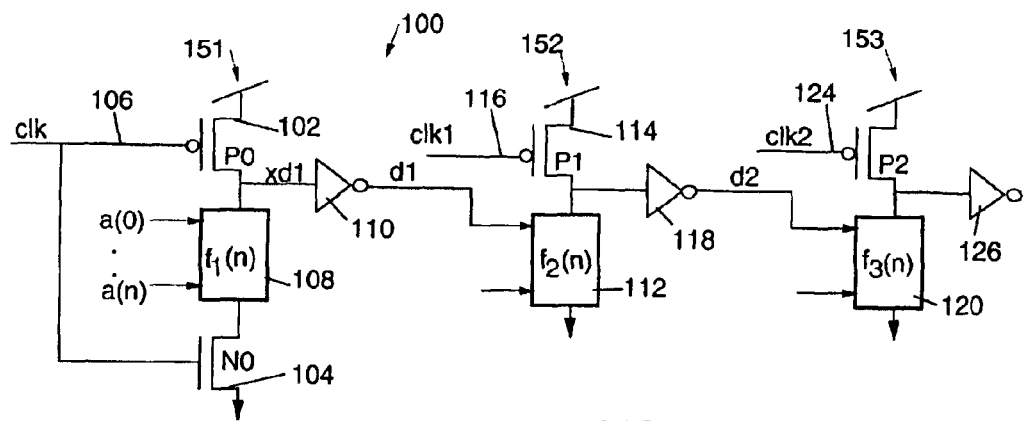
FIG. 1A shows a portion of an electrical circuit designed following the ripple-domino concept as known in the art.
Figure 1B:
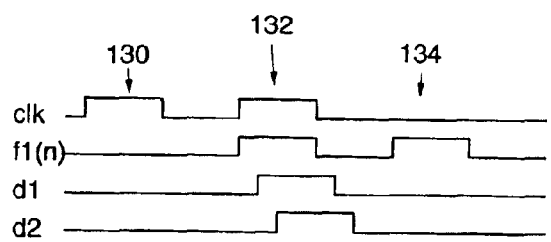
FIG. 1B shows a timing diagram illustrating changes of voltage levels in the circuit of FIG. 1A.

With reference to FIGS. 1A and 1B, in FIG. 1A there is depicted an electrical circuit 100 designed following the ripple-domino concept, whereas FIG. 1B shows a respective timing diagram illustrating changes of voltage levels in the circuit of FIG. 1A.

Ripple-Domino is an extremely fast-clocked dynamic circuit style. As illustrated in FIG. 1A, it includes a first PFET (P-Type Field Effect Transistor) device 102 (P0), also called "restore device" and first NFET (N-Type Field Effect Transistor) device 104 (N0), also called "footer device", the gates of which both being connected to a first clock signal line 106 transmitting a first clock signal (clk). The drain of the first PFET device 102 is connected to a non-ground power supply line (not shown), whereas the source of the first NFET device 104 is connected to a ground power supply line (not shown). Between the drain of the first PFET device 102 and the drain of the first NFET device a first evaluation network 108 implementing a logical function f1(n) depending on inputs a(0) to a(n) is provided, whereby the first evaluation network 108 preferably consists of NFET devices only. The additional add of PFETs restore devices to the NFET network may also be present to compensate for effects like charge sharing. The line between the first PFET device 102 and the first evaluation network 108 branches to an input (node xd1) of a first inverter device 110, the output of which (node d1) is provided as an input for a second evaluation network 112.

Correspondingly, the gate of a second PFET device 114 is connected to a second clock line 116 transmitting a second clock signal (clk1), the source of it is connected to VDD and the drain is connected to the second evaluation network 112 and a second inverter device 118, the output of which is provided as an input for a third evaluation network 120. A third PFET device 122 is connected to a third clock line 124 transmitting a third clock signal (clk2), the source of it is connected to VDD and the drain is connected to the third evaluation network 120 and a third inverter device 126. In both cases the evaluation network 112 and 120 is connected to ground.

The operation is now explained with respect to the arrangement including the first clock (clk) the first PFET, NFET, inverter devices 102, 104, 110 and the first evaluation network 108. It is acknowledged that the other arrangements function equivalently.

As long as the first clock (clk) is switched off, also referred to as "restore phase", the first NFET device 104 is turned off guaranteeing that no path from node xd1 to ground exists independent from the state of the first evaluation network 108. At the same time the first PFET device 102 is switched on, forcing the node xd1 to VDD, which shall represent a logical 1 in binary logic, and thereby node d1 to 0, i.e. ground.

If the clock turns on, also referred to as "evaluation phase", the pre-charged node xd1 gets disconnected from VDD, i.e., the first PFET device gets turned off. At the same time the footer device (first NFET device 104) gets switched on. The value of node xd1 now depends on the logical network f1(n) implemented by the first evaluation network 108. If it evaluates to false node xd1 stays high and correspondingly, node d1 stays low. However, in case it evaluates to true xd1 is pulled down and, consequently, d1 goes high, as illustrated in the first and second cycle 130, 132 in pulse diagram of FIG. 1B.

Thus, a switching event only occurs, if the first clock clk is on high level and the evaluation network as a function of the data inputs a(0) to a(n) results to true. In order to prevent a switching event to occur as a result of anyone of all input pattern, the clock has to be gated and turned off, illustrated in the third cycle 134 of the timing diagram of FIG. 1B.

In case that during evaluation no pull down-path exists, the node xd1 is in a dynamic state keeping the high level from the restore phase. In order to recover from charge loss due to leakage and/or noise, injection a half latch devices (or alternatively a keeper or bleeder device) can be added (not shown).

It should be noted that the footer device N0 is only needed, if the inputs a(0) to a(n) come from a static environment, i.e., not timed environment. The inputs have to be valid before the clock activates (setup time requirement). The footer device prevents any false switching during the restore phase.

Behind that first stage 151 all signal are in a clocked fashion. Therefore, the following stages 152, 153 no longer need the footer device. During restore all internal signals, i.e., on nodes d1 and d2, are restored to 0. If the evaluation networks f2(n), f3(n) are build in a way that the state is false as long as all inputs are 0 no pull-down can exist, no switching can occur (always true because only NFET devices are used within the logic block). So if any switching on the first stage 151 is suppressed, also the switching on all following stages 152, 153 is prevented. Therefore, only the first stage 151 has to be controlled in order to gate the complete logical chain.

The stages 152 and 153 are connected to a delayed clock clk1 and clk2 to prevent any short circuit current during restore. They are delayed from clk in a way to line up with the stage delay, also referred to as "delayed reset ripple-domino". It is acknowledged that if alternative transistors were used, e.g., P-Channel transistors instead of N-Channel transistors, the logic levels would change accordingly. Furthermore, a short circuit during restore can alternatively be prevented by the adding to each stage a footer device instead of delaying the clocks clk1 and clk2 relative to clk with the drawback that the total circuit becomes slower.

Figure 2:
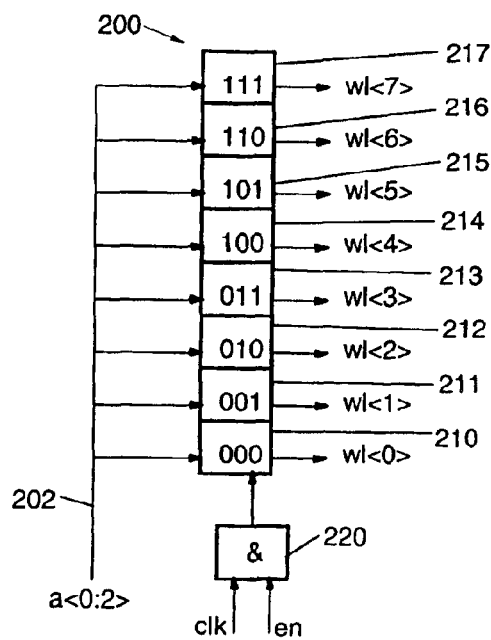
FIG. 2 shows an address word decoder using the ripple domino concept and clock line gating for disabling the address word decoder.

With reference now to FIG. 2, there is depicted an address word decoder 200 using the ripple domino concept and clock line gating for disabling the address word decoder. An address bus 202 consisting of three address lines transmits a 3-bit address word to 8 decoding blocks 210 to 217, whereby each decoding block is associated to one address of the address space formed by the 3-bit address word, namely, address block 210 is associated to address 000, address block 211 is associated to address 001, address block 212 is associated to address 010, address block 213 is associated to address 011, address block 214 is associated to address 100, address block 215 is associated to address 101, address block 216 is associated to address 110, address block 217 is associated to address 111.

Each of the 8 decoding blocks 210 to 217 generates one word-line signal wl<0:7>, i.e., the decoding blocks 210 to 217 translate the 3-bit address a<0:2> into 8 word-line signals wl<0:7>. The decoding blocks 210 to 217 are implemented using the basic domino scheme as discussed before.

The associated address indicates at which combination of input signals a<0:2> the single word line wl<i>, with i=(0 ... 7), generated by the block gets switched to the active state. Because the complete address space is decoded at any given combination of a<0:2> the word line of only one block will always switch, one and only one. In order to prevent switching, an AND-gate 220 is provided for turning off the clock by gating the clock signal (clk) with an enable signal (en). It should be noted that the additional gating of the clock has a direct impact on the delay of the whole scheme. The delay is directly triggered from the rising edged of the clock but now this clock has to be 'anded' with the enable signal (en) before. So the clock signal (clk) to wl<0:7> delay will be increase by the delay of the 'and' block.

Furthermore, the enable signal (en) is an additional signal to be generated by the external logic. It is timing critical because it has to be available before the clock to prevent false switching.

Figure 3:
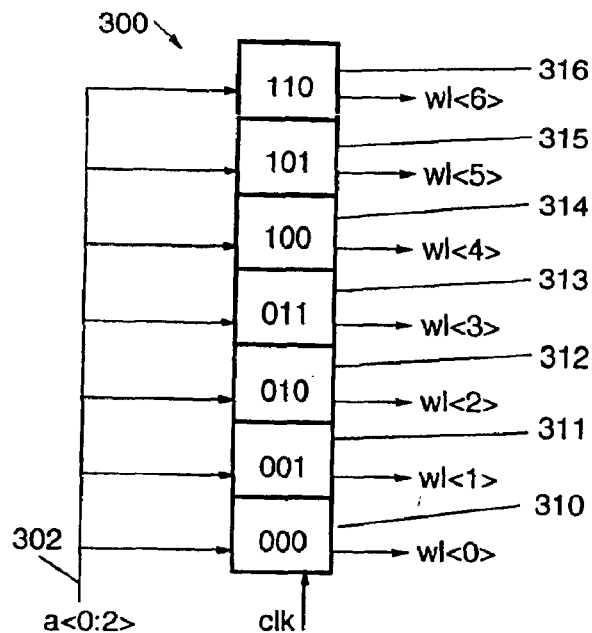
FIG. 3 shows an address word decoder using the ripple domino concept in accordance with the present invention.

With reference now to FIG. 3, there is depicted an address word decoder 300 using the ripple domino concept in accordance with the present invention. An address bus 302 consisting of three address lines transmits a 3-bit address word to 7 decoding blocks 310 to 317, whereby each decoding block is associated to one address of the address space formed by the 3-bit address word, namely, address block 310 is associated to address 000, address block 311 is associated to address 001, address block 312 is associated to address 010, address block 313 is associated to address 011, address block 314 is associated to address 100, address block 315 is associated to address 101, and address block 316 is associated to address 110.

Each of the 7 decoding blocks 310 to 317 generates one word-line signal wl<0:6>, i.e., the decoding blocks 310 to 316 translate the 3-bit address a<0:2> into 7 word-line signals wl<0:6>. The decoding blocks 310 to 316 are implemented using the basic domino scheme as discussed before.

The associated address indicates at which combination of input signals a<0:2> one block gets activated. Because, in accordance with the present invention the complete address space is not decoded, advantageously none of the blocks will switch if the given combination of a<0:2> is 111, i.e., whenever the provided address word addresses the omitted decoding block, here the one associated to the address 111. In other words, in order to prevent switching only the address of the omitted decoding block needs to be applied and, hence, no delay will be caused.

Furthermore, no additional enable signal is required, the generation of which might be time critical as well. Advantageously, the gating of the clock is omitted and the word decoder is directly connected to the clock. This guarantees the fastest possible switching.

Figure 4:
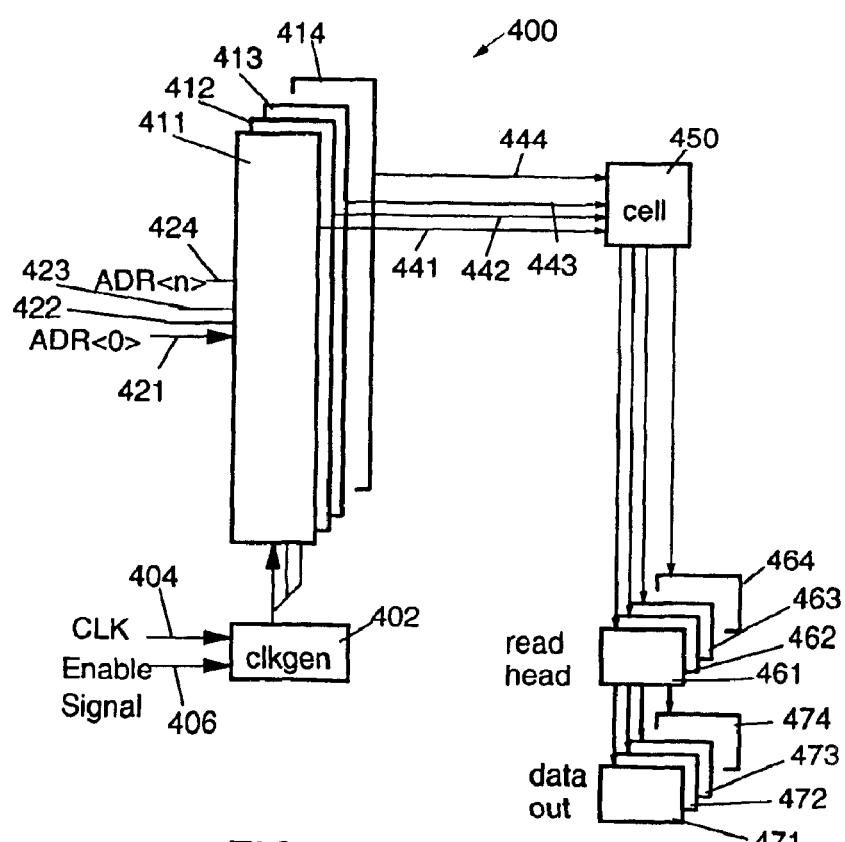
FIG. 4 shows an k-Port Storage Array Structure in accordance with the present invention.

With reference now to FIG. 4, there is depicted the k read ports of a Storage Array Structure 400 in accordance with the present invention, i.e., an k-Port Storage Array Structure having k address word decoder using the ripple domino concept in accordance with the present invention as described with reference to FIG. 3.

According to the present invention at least one address of the address space defined by the address word is specified as an 'invalid' address, i.e. 1111, 0000 or any other 4 bit number, which cannot be used for data allocation. This can be accomplished by simply immolating one address, which has almost no impact on system performance in case of large arrays, or by adding an extra bit to the address, which acts as an integrated enable signal. There are also situations, where a given area drives the array size so that a non-binary address space results in the best utilization and, hence, the invalid address is given 'for free'.

A central circuit 402 (clkgen) controls the complete internal timing with a clock signal CLK provided as an input by clock line 404. Optionally, an additional select signal provided by select signal line 406 may deactivate the functionality of the whole array by gating the clock. This can be used to switch off the whole array for cases in which the select signal can be generated as a none timing critical signal, for example, when the processor is idle since no program needs to be executed. The central circuit 402 delivers the clock signal to each of the four word decoding devices 411, 412, 413 and 414 for decoding an address word provided by address lines 421 to 424 into word-line signals 431 to 434.

The word decoding devices 411 to 414 decode the binary input address ADR<0:3> into a signal word-line and thereby selects a storage line of a cell 450 to be read or written. For read the selected cell drives its stored data onto the bit-line and the following stages, namely read heads 461 to 464 and data out units 471 to 474. In domino type arrays a switching event in the first stage ripples automatically through the following circuits thereby consuming power.

In case of an invalid address, no word-line is selected and thereby no switching on the bit-line and all following circuits occurs. With multi-port arrays this can advantageously be done on a port-by-port basis. No additional circuit is advantageously be required, because the address by itself leads to no switching. Only a small circuitry is shared between the individual ports, which have to be active as long as at least one port is active. The whole array can optionally be deactivated, if necessary, with the select signal.

This scheme adds no additional control circuits to the array but eliminates the enable signal for each port. The function is coded into the address and thereby hidden in the logic, which generates the address. The word decoder basically remains unchanged.

Another advantage is that the solution according to the present invention has no impact on timing, i.e., no timing critical select signal is necessary and the total number of inputs and the chip level wiring is reduced.

With this feature no additional control signals are needed. The functionality comes out of the logic coded into the address.

The power consumption of the array has granularity between min and max determined by the total number of ports. The actual power depends on the number of active ports. This allows a power management with a fine granularity, which leads to a reduced on-chip power noise (di/dt).

While the preferred embodiment of the invention has been illustrated and described herein, it is to be understood that the invention is not limited to the precise construction herein disclosed, and the right is reserved to all changes and modifications coming within the scope of the invention as defined in the appended claims.

What is claimed is:

1. A device for decoding an address word into word-line signals, the device comprising:
   a plurality of address lines for inputting said address word,
   a plurality of decoding blocks each associated with a particular address in an address space formed by said address word for generating a respective word-line signals, whereby each of said decoding blocks is connected to said plurality of address lines,
   said decoding blocks being structured with said address space such that a decoding block is present or omitted, whereby word lines of a predetermined address associated with the omitted decoding block are not switched to the active state when said predetermined word is inputted over said plurality of address lines.

2. The device according to claim 1, further comprising a clock signal line for inputting a clock signal, whereby said clock signal line is directly connected to each of said decoding blocks.

3. The device according to claim 1 wherein said decoding block is implemented using the ripple-domino concept.

4. The device according to claim 1 wherein the address word is (n+1)-Bit wide forming an address space of $2^{n+1}-2$ or less addresses, whereby n is a positive integer number.

5. An k-port storage array structure comprising:

a memory cell for storing information, k address ports for inputting address words, k devices for decoding an address word into word-line signals on word lines, said k devices being structured with said memory cell such that a k device is present or omitted, whereby word lines of a predetermined address associated with the omitted k device are not switched to the active state when said predetermined word is inputted over said k address ports.

6. The k-port storage array structure according to claim 5, further comprising a clock signal line for inputting a clock signal, whereby said clock signal line is directly connected to each of said k devices.

7. The k-port storage array structure according to claim 5 wherein said k devices are implemented using the ripple-domino concept.

8. The k-port storage array structure according to claim 5 wherein the address word is (n+1)-Bit wide forming an address space of $2^{n+1}-2$ or less addresses, whereby n is a positive integer number.

9. The k-port storage array structure according to claim 6, further comprising a central circuit for delivering the clock signal to said k devices for decoding an address word, whereby the central circuit is adapted to block the clock signal depending on an enable signal provided to said central circuit.

* * * * *